United States Patent
Haruna

(10) Patent No.: US 9,887,675 B2
(45) Date of Patent: Feb. 6, 2018

(54) POWER AMPLIFIER

(71) Applicant: Mitsubishi Electric Corporation, Tokyo (JP)

(72) Inventor: Takao Haruna, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/283,616

(22) Filed: Oct. 3, 2016

(65) Prior Publication Data

US 2017/0272041 A1    Sep. 21, 2017

(30) Foreign Application Priority Data

Mar. 18, 2016  (JP) .................................. 2016-055194

(51) Int. Cl.
| | | |
|---|---|---|
| *H03F 3/191* | (2006.01) | |
| *H03F 1/56* | (2006.01) | |
| *H03F 3/193* | (2006.01) | |
| *H03F 3/21* | (2006.01) | |

(52) U.S. Cl.
CPC ............ *H03F 1/565* (2013.01); *H03F 3/193* (2013.01); *H03F 3/21* (2013.01); *H03F 2200/225* (2013.01); *H03F 2200/451* (2013.01)

(58) Field of Classification Search
CPC .................................. H03F 3/191; H03F 3/187
USPC ................................................. 330/302, 307
See application file for complete search history.

(56) References Cited

U.S. PATENT DOCUMENTS

| | | | | |
|---|---|---|---|---|
| 7,298,213 | B2* | 11/2007 | Kang ........................ | H03F 1/26 327/314 |
| 7,323,939 | B2* | 1/2008 | Han ........................ | H03F 1/223 330/305 |
| 9,214,910 | B2* | 12/2015 | Ogasawara ............... | H03F 1/52 |
| 9,331,640 | B2* | 5/2016 | Miyazawa ................ | H03F 1/56 |
| 2006/0132242 | A1* | 6/2006 | Han ........................ | H03F 1/223 330/311 |

FOREIGN PATENT DOCUMENTS

| | | |
|---|---|---|
| JP | 2001-053510 A | 2/2001 |
| JP | 2008-205223 A | 9/2008 |
| JP | 2009-159591 A | 7/2009 |
| JP | 2012-205246 A | 10/2012 |

OTHER PUBLICATIONS

Inoue et al.; Analysis of Class-F and Inverse Class-F Amplifiers; Technical Report of IEICE; ED2000-231, MW2000-180, ICD2000-191; 2001; pp. 29-35.

An Office Action; "Notification of Reason for Refusal," mailed by the Korean Patent Office dated Nov. 27, 2017, which corresponds to Korean Patent Application No. 10-2016-0178823 and is related to U.S. Appl. No. 15/283,616; with English Translation.

* cited by examiner

*Primary Examiner* — Henry Choe
(74) *Attorney, Agent, or Firm* — Studebaker & Brackett PC

(57) ABSTRACT

A power amplifier includes: a transistor having a gate electrode, a source electrode and a drain electrode; a passive component part connected to the gate electrode through a gate wiring; and a harmonic circuit connected between the source electrode and the gate wiring and disposed in a region between the gate electrode and the passive component part and between the source electrode and the gate wiring.

11 Claims, 6 Drawing Sheets freq(500.0MHz to 21.00GHz)
PHASE IS 2fo(f=20GHz) WITH fo=10GHz
fo=10GHz
(HALFTONE DOT MESHING)

1

POWER AMPLIFIER

BACKGROUND OF THE INVENTION

Field

The present invention relates to a radiofrequency power amplifier used in a communication appliance of a microwave band or a milliwave band, for example, from several megahertz to several hundred gigahertz for mobile communication, satellite communication, etc.

Background

In conventional power amplifiers, a harmonic circuit which reflects a harmonic of an optimum phase for a transistor is used to improve the power-added efficiency (PAE) of the transistor (see, for example, JP 2012-205246 A, JP 2009-159591 A and JP 2001-53510 A). In the harmonic circuit, there is a need to set an impedance for a short for an even harmonic, such as the second harmonic in the case of class-F operation, and to set an impedance for a short for an odd harmonic such as the third or higher harmonic in the case of inverse class-F operation (see, for example, Akira Inoue and four others, "Analysis of Class-F and Inverse Class-F Amplifiers", Shingaku Giho, The Institute of Electronics, Information and Communication Engineers (General Incorporated Association), TECHNICAL REPORT OF IEICE ED 2003-214, ED2000-231, p. 29-35). As the harmonic circuit, a capacitor, wire, or open stub is connected to an input or output terminal of the transistor.

In the conventional power amplifiers, a harmonic circuit is provided outside a transistor and, therefore, wires, wiring elements or the like exist between the transistor and the harmonic circuit. A parasitic inductance and a parasitic resistance are caused thereby and it is difficult to set an impedance for a desired harmonic.

SUMMARY

To solve the above-described problem, an object of the present invention is to provide a power amplifier capable of easily setting an impedance for a harmonic and improving the power-added efficiency.

According to the present invention, a power amplifier includes: a transistor having a gate electrode, a source electrode and a drain electrode; a passive component part connected to the gate electrode through a gate wiring; and a harmonic circuit connected between the source electrode and the gate wiring and disposed in a region between the gate electrode and the passive component part and between the source electrode and the gate wiring.

In the present invention, the harmonic circuit is disposed in a region between the gate electrode and the passive component part and between the source electrode and the gate wiring.

Because a parasitic inductance and a parasitic resistance of the harmonic circuit can be reduced thereby, an impedance for a harmonic can easily be set to a desired value and the power-added efficiency can be improved.

Other and further objects, features and advantages of the invention will appear more fully from the following description.

2

Figure 3:
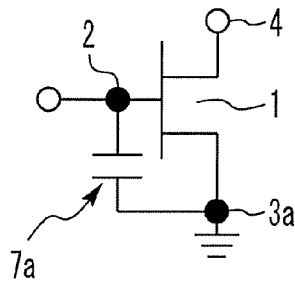

FIG. 3 is a circuit diagram of the power amplifier according to the first embodiment of the present invention.

Figure 4:
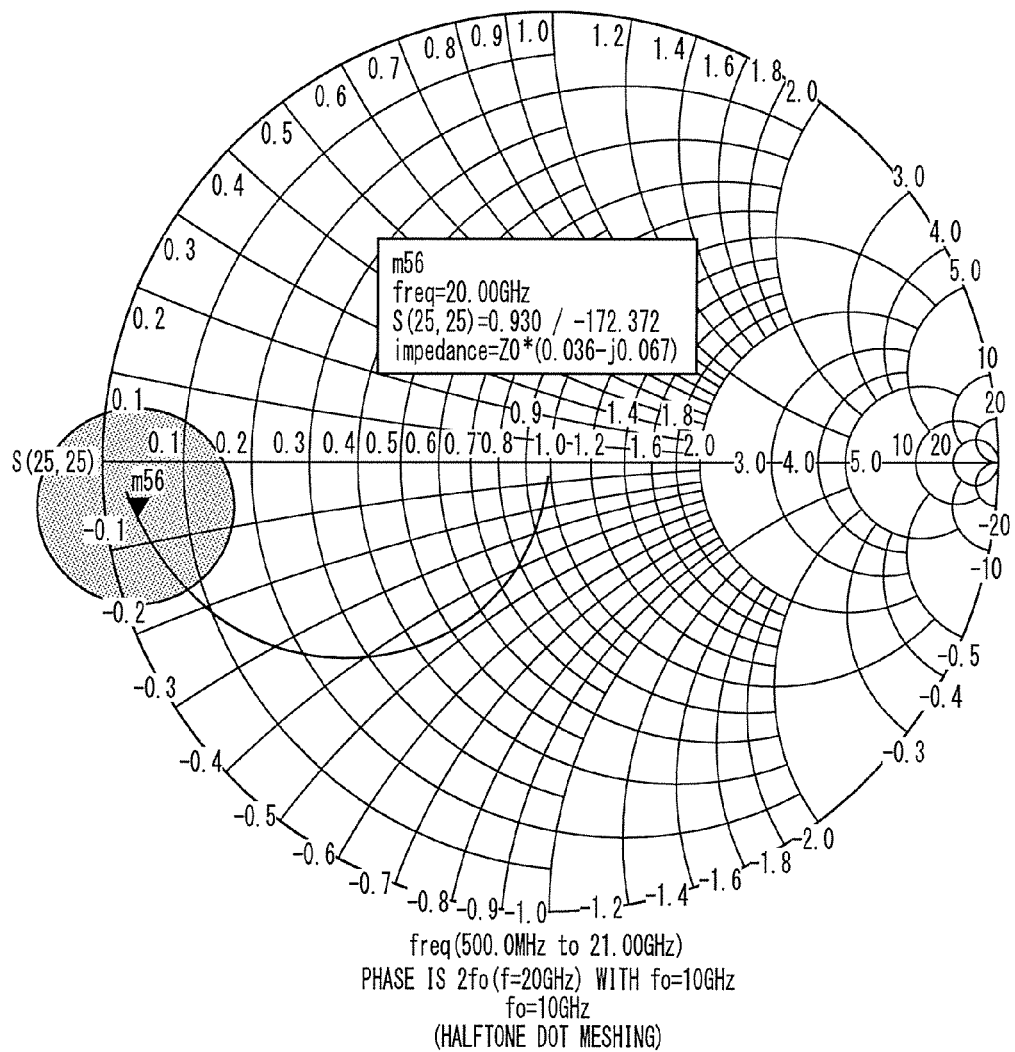

FIG. 4 is a diagram showing the results of designing a harmonic (second harmonic) with respect to a fundamental wave of 10 GHz in the power amplifier according to the first embodiment of the present invention.

Figure 5:
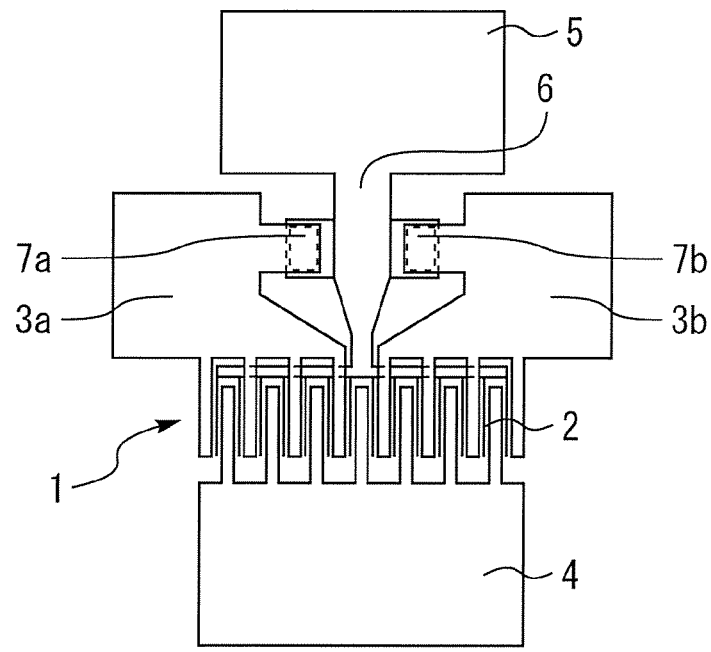

FIG. 5 is a plan view of a power amplifier according to a second embodiment of the present invention.

Figure 6:
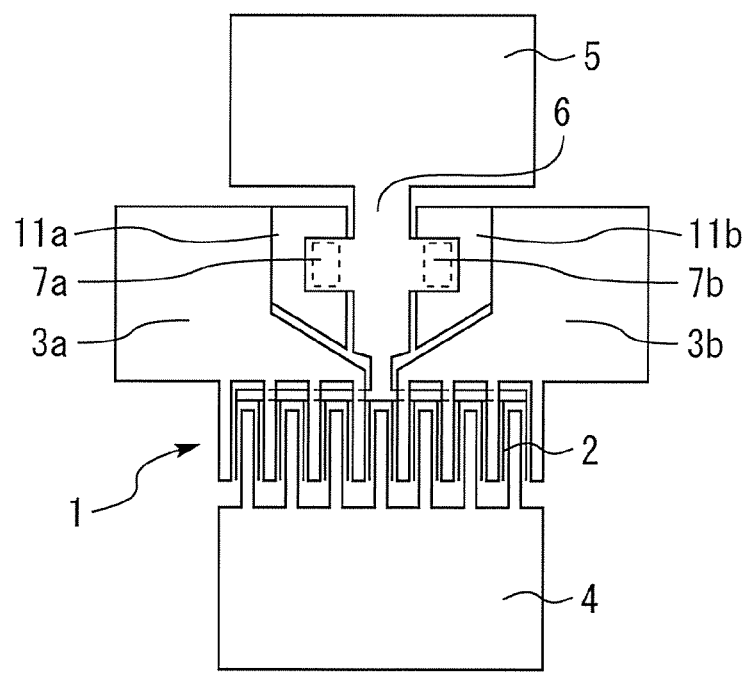

FIG. 6 is a plan view of a power amplifier according to a third embodiment of the present invention.

Figure 7:
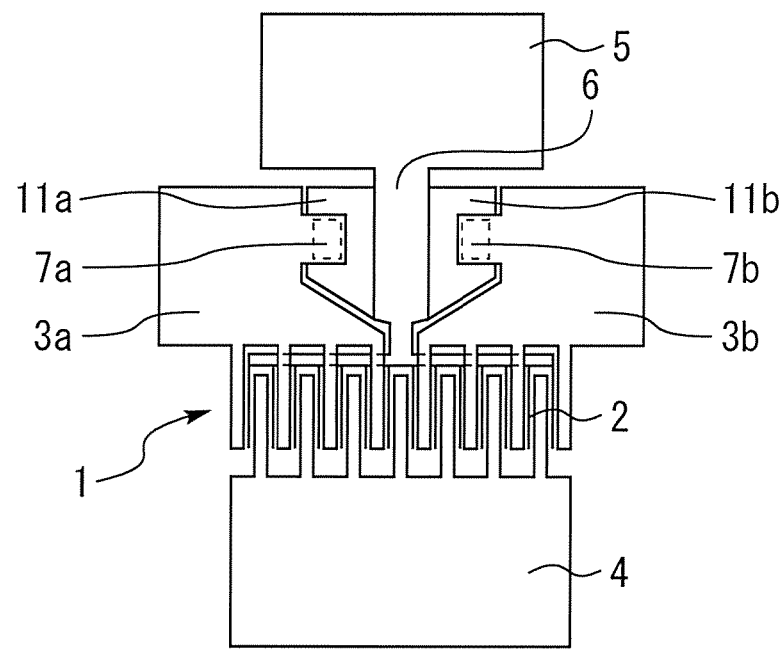

FIG. 7 is a plan view of a modified example of the power amplifier according to the third embodiment of the present invention.

Figure 8:
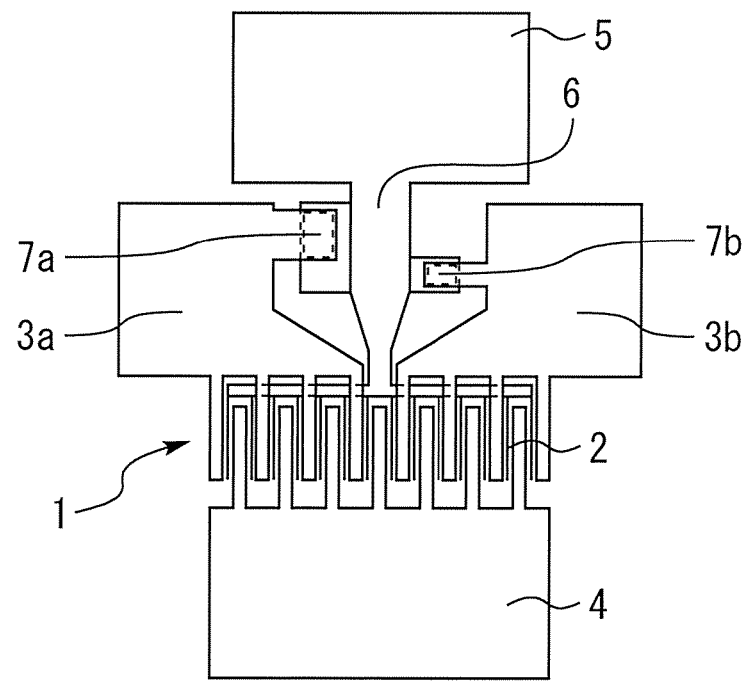

FIG. 8 is a plan view of a power amplifier according to a fourth embodiment of the present invention.

Figure 9:
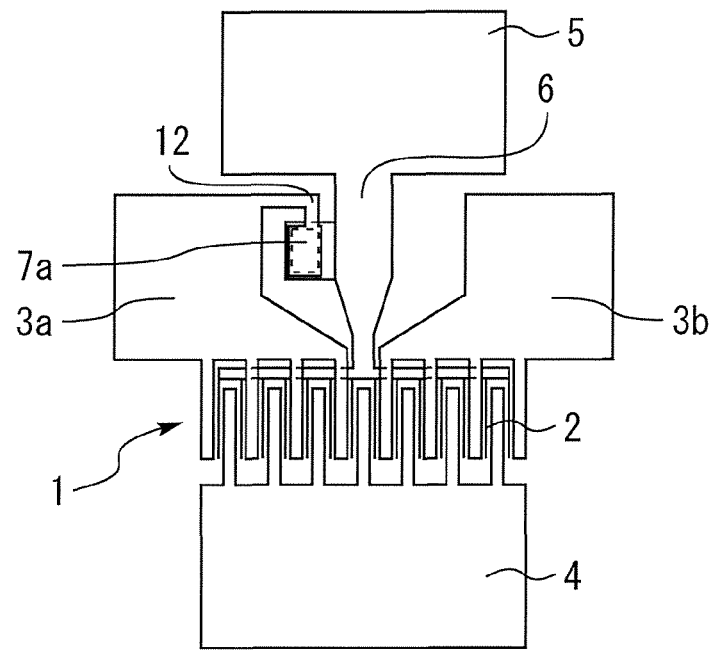

FIG. 9 is a plan view of a power amplifier according to a fifth embodiment of the present invention.

Figure 10:
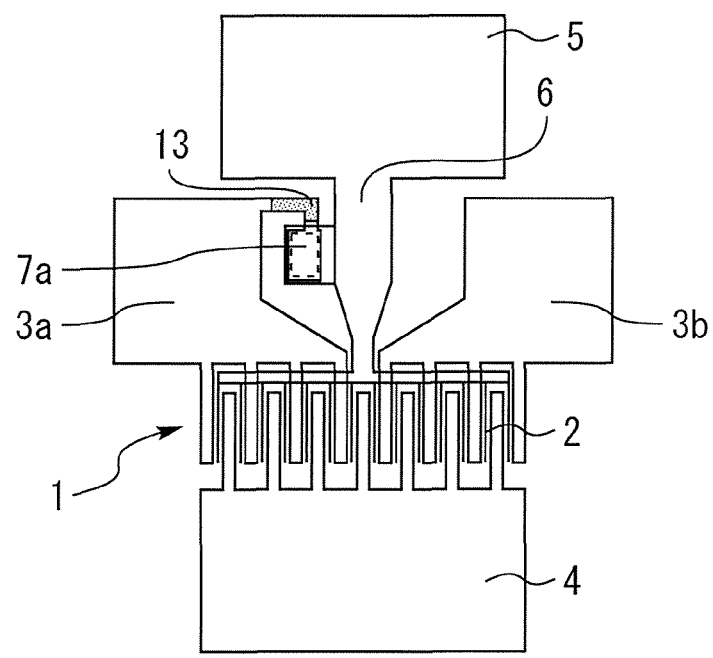

FIG. 10 is a plan view of a power amplifier according to a sixth embodiment of the present invention.

Figure 11:
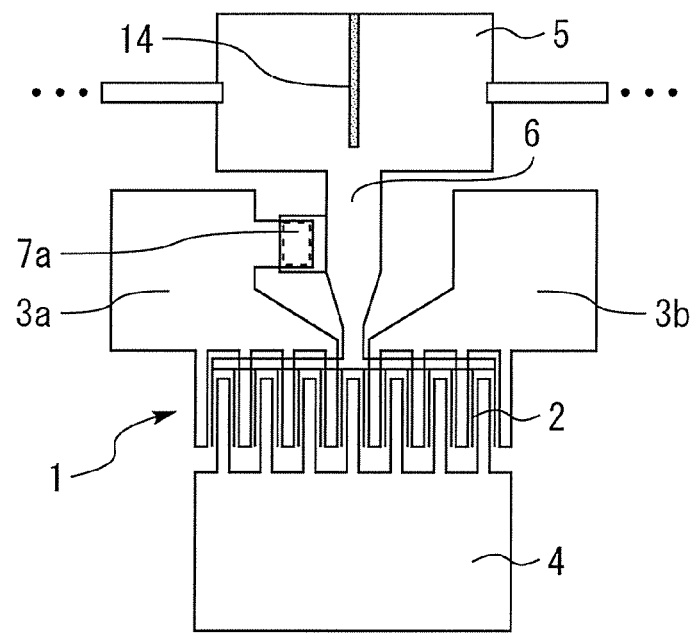

FIG. 11 is a plan view of a power amplifier according to a seventh embodiment of the present invention.

Figure 12:
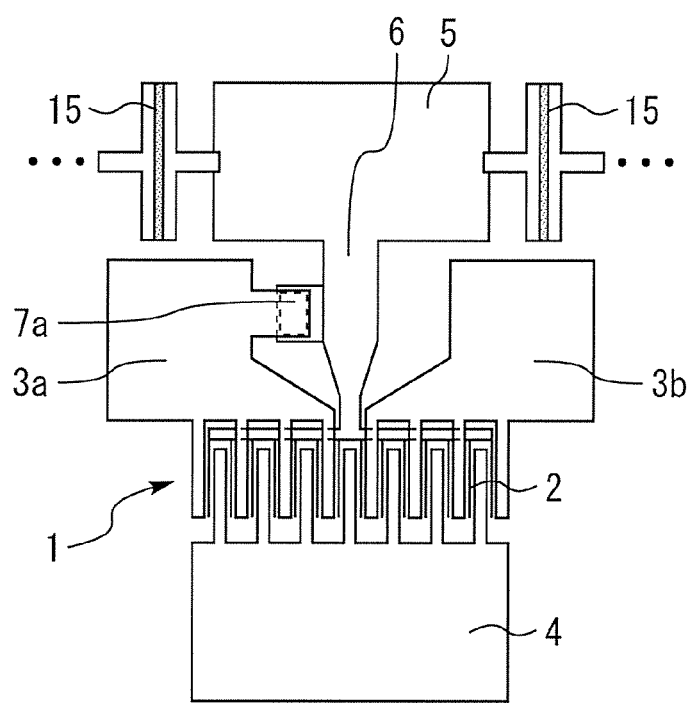

FIG. 12 is a plan view of a power amplifier according to an eighth embodiment of the present invention.

DESCRIPTION OF EMBODIMENTS

A power amplifier according to the embodiments of the present invention will be described with reference to the drawings. The same components will be denoted by the same symbols, and the repeated description thereof may be omitted.

First Embodiment

Figure 1:
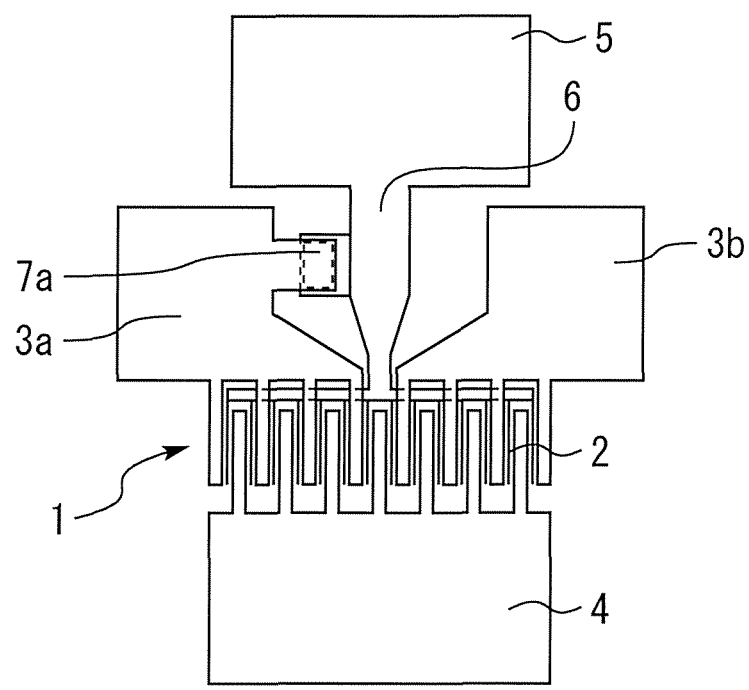
FIG. 1 is a plan view of a power amplifier according to a first embodiment of the present invention.

FIG. 1 is a plan view of a power amplifier according to a first embodiment of the present invention. A transistor 1 is formed on a substrate (not shown). The transistor 1 has a gate electrode 2, source electrodes 3a and 3b and a drain electrode 4. A gate pad 5, which is one of passive component parts, is connected to the gate electrode 2 through gate wiring 6. The source electrodes 3a and 3b are respectively disposed on opposite sides of the gate wiring 6. A harmonic circuit 7a is connected between the source electrode 3a and the gate wiring 6.

Figure 2:
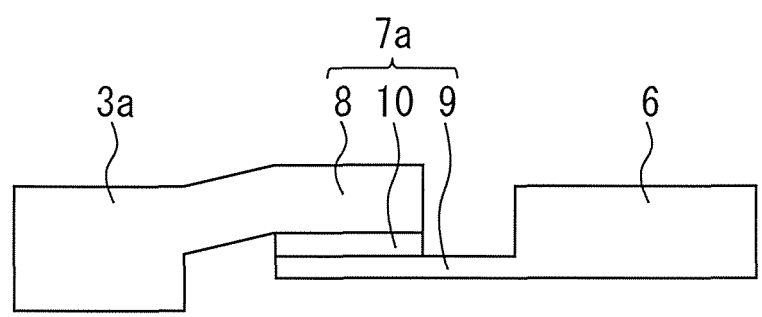
FIG. 2 is a sectional view showing the harmonic circuit according to the first embodiment of the present invention.

FIG. 2 is a sectional view showing the harmonic circuit according to the first embodiment of the present invention. An insulating material 10 is provided between an upper electrode 8 extending from the source electrode 3a and a lower electrode 9 extending from the gate wiring 6, thereby forming a MIM capacitor.

FIG. 3 is a circuit diagram of the power amplifier according to the first embodiment of the present invention. With the MIM capacitor in the harmonic circuit 7a, an impedance for a harmonic as seen from the gate electrode 2 of the transistor 1 is set to a value for a short.

In the present embodiment, the harmonic circuit 7a is disposed in a region between the gate electrode 2 and the gate pad 5 and between the source electrode 3a and the gate wiring 6. Because a parasitic inductance and a parasitic resistance of the harmonic circuit 7a can be reduced thereby, an impedance for a harmonic can easily be set to a desired value.

When the phase of a harmonic is based on inductive reactance, the power-added efficiency of the power amplifier is reduced. If the parasitic inductance component is reduced, it is easier to keep the phase of the harmonic based on capacitive reactance, which is preferable in terms of characteristic of the power amplifier. Further, turning of the phase can be slackened; in particular, the design of the harmonic circuit is made easier even at frequencies equal to or higher than several gigahertz; and manufacturing variations are reduced. Also, since the parasitic resistance is reduced, it becomes easier to bring Γ for the harmonic closer to 1, thus improving the power-added efficiency of the power amplifier.

FIG. 4 is a diagram showing the results of designing a harmonic (second harmonic) with respect to a fundamental wave of 10 GHz in the power amplifier according to the first embodiment of the present invention. As can be understood from the diagram, matching to a harmonic impedance at which the power-added efficiency of the power amplifier is improved has been achieved, the impedance for second harmonic 20 GHz being Γ=0.930, the phase of the second harmonic being about −172°.

Also, since the harmonic circuit 7a is disposed in proximity to the gate electrode 2 of the transistor 1, the harmonic circuit 7a is not substantially influenced by variation in phase of the harmonic due to the influence of a circuit outside the gate pad 5. Therefore, the circuit for the fundamental wave can be designed without paying attention to the harmonic outside the gate pad 5, thus enabling improving the power-added efficiency of the power amplifier.

The harmonic circuit 7a is not limited to the MIM capacitor. The harmonic circuit 7a may alternatively have pads, a wiring pattern, an inductor, a resistor and parasitic capacitances that such elements have between substrates. In a case where transistors 1 are connected in parallel with each other, for example, for the purpose of increasing the output power of the power amplifier, the harmonic circuits 7a are connected to each other by using, for example, a resistor.

Second Embodiment

FIG. 5 is a plan view of a power amplifier according to a second embodiment of the present invention. In this embodiment, not only the harmonic circuit 7a disposed and connected between the source electrode 3a and the gate wiring 6 but also a harmonic circuit 7b disposed and connected between the source electrode 3b and the gate wiring 6 is provided. In other respects, the configuration is the same as that in the first embodiment.

With this arrangement, the parasitic inductances and the parasitic resistances from the harmonic circuits 7a and 7b to the source electrodes 3a and 3b can be reduced. As a result, the facility with which the phase of a harmonic is kept based on capacitive reactance, the facility with which Γ for the harmonic is brought closer to 1 and the facility with which a harmonic impedance as seen from the transistor 1 is controlled are improved.

The harmonic circuits 7a and 7b are bilaterally symmetrically disposed, with the gate wiring 6 interposed therebetween. Therefore, the harmonic impedances of the harmonic circuits 7a and 7b as seen from the right and left ends of the transistor 1 appear to be equal to each other.

As a result, oscillation in the transistor 1 can be inhibited. Also, a uniform RF operation in the transistor 1 can be achieved, thereby improving the power-added efficiency of the power amplifier. Wrong power distribution can occur easily in the transistor 1 at frequencies equal to or higher than several ten gigahertz in particular. It is, therefore, desirable to dispose the harmonic circuits 7a and 7b in symmetry as seen from the transistor I.

Third Embodiment

FIG. 6 is a plan view of a power amplifier according to a third embodiment of the present invention. In this embodiment, wiring elements 11a and 11b respectively connected to the source electrodes 3a to 3b and having the same potential are provided. Harmonic circuits 7a and 7b are respectively disposed on the wiring elements 11a and 11b. The wiring elements 11a and 11b are larger in width than the harmonic circuits 7a and 7b. In other respects, the configuration is the same as that in the second embodiment.

With this arrangement, the parasitic inductances and the parasitic resistances from the harmonic circuits 7a and 7b to the source electrodes 3a and 3b can be reduced. As a result, the facility with which the phase of a harmonic is kept based on capacitive reactance, the facility with which Γ for the harmonic is brought closer to 1 and the facility with which a harmonic impedance as seen from the transistor 1 is controlled are improved, thereby improving the power-added efficiency of the power amplifier.

FIG. 7 is a plan view of a modified example of the power amplifier according to the third embodiment of the present invention. Wiring elements 11a and 11b are connected to the gate wiring 6 and having the same potential. The same advantages as those of the third embodiment can also be obtained in this case.

Fourth Embodiment

FIG. 8 is a plan view of a power amplifier according to a fourth embodiment of the present invention. An impedance for a harmonic depends on the size of the harmonic circuit, i.e., the capacitance of the capacitor and the wiring length (inductance value). If the size of the harmonic circuit is reduced, the harmonic circuit can operate for a harmonic in a radiofrequency band of several ten gigahertz. If the size of the harmonic circuit is increased, the harmonic circuit can operate for a harmonic in a low frequency band of several megahertz. In the present embodiment, harmonic circuits 7a and 7b differing in size are provided to enable matching of harmonic impedance matching in frequency bands corresponding to the harmonic circuits 7a and 7b and to enable the power amplifier to have a widened frequency band in which the power-added efficiency is high.

For harmonic impedance matching, there is a need to bring a harmonic circuit acting on a higher frequency band close to the gate electrode 2 of the transistor 1. Therefore, the harmonic circuit 7b smaller in size is disposed closer to the transistor 1 than the harmonic circuit 7a larger in size. Three or more harmonic circuits differing in size may be provided. However, there is a need to dispose closer to the transistor 1 the harmonic circuit smaller in size.

Fifth Embodiment

FIG. 9 is a plan view of a power amplifier according to a fifth embodiment of the present invention. In this embodiment, the harmonic circuit 7a has a wiring element 12 connected between the MIM capacitor and the source electrode 3a. The wiring element 12 may alternatively be connected between the MIM capacitor and the gate wiring 6. In other respects, the configuration is the same as that in the first embodiment.

The wiring element 12 is positively inserted to enable LC resonance at a desired frequency between the wiring element 12 and the MIM capacitor. The facility with which Γ for a harmonic is brought closer to 1 in a desired frequency band is improved thereby. Also, the LC resonance enables setting of an impedance for the desired harmonic even if the capacitance of the harmonic circuit 7a is reduced. A power amplifier reduced in size and having improved power-added efficiency can thus be obtained.

Sixth Embodiment

FIG. 10 is a plan view of a power amplifier according to a sixth embodiment of the present invention. In this embodiment, the harmonic circuit 7a has a resistor element 13 connected between the MIM capacitor and the source electrode 3a. The resistor element 13 may alternatively be connected between the MIM capacitor and the gate wiring 6.

Positively inserting the resistor element 13 results in a reduction in Γ for a harmonic from 1 but enables reducing variation in phase of the harmonic. While the improvement in power-added efficiency of the power amplifier is reduced as a result of reducing Γ for the harmonic from 1, variation in phase of the harmonic can be reduced and, therefore, the facility with which a wide-band power amplifier is made is improved. Also, there is no need to provide a plurality of harmonic circuits 7a as in the fourth embodiment, and the power amplifier can be reduced in size.

Seventh Embodiment

FIG. 11 is a plan view of a power amplifier according to a seventh embodiment of the present invention. In this embodiment, gate pads of other power amplifiers are respectively connected in parallel with first and second sides of the gate pad 5 opposite from each other.

In a case where a plurality of transistors for RF operation in a band of several tens of gigahertz or more in particular are disposed in parallel with each other, there is a possibility of an oscillation condition being satisfied in some of the transistors or between the transistors, since the wiring element and the capacitance are inserted between the gate pad 5 and the gate electrode 2 by providing the harmonic circuit 7a.

Therefore a resistor element 14 is inserted in the gate pad 5 between the first and second sides. Isolation in each transistor or between the transistors is thereby improved. As a result, a power amplifier which does not easily oscillate can be obtained. While the gate pad 5 is used as a passive component part in the present embodiment, any type of passive component part may suffice if the resistor element 14 can be inserted at a center thereof.

Eighth Embodiment

FIG. 12 is a plan view of a power amplifier according to an eighth embodiment of the present invention. In this embodiment, other power amplifiers are connected in parallel with the gate pad 5, and resistor elements 15 are connected between the gate pad 5 and the other power amplifiers. Isolation between the transistors is improved thereby. As a result, a power amplifier which does not easily oscillate can be obtained.

There is a demand for minimizing a loss in the circuit due to the resistor element 14 or 15 in the seventh or eighth embodiment. On the other hand, it is not necessary to make the resistor element 14 or 15 for isolation function in high-temperature operation as highly as in room-temperature operation, since the performance of the transistor 1 is reduced during high-temperature operation. It is, therefore, preferable that the resistor element 14 or 15 have such a characteristic that its resistance value increases with increase in temperature. The resistor element 14 or 15 is thereby made to not have a high resistance for the RF signal during high-temperature operation. The reduction in power-added efficiency of the power amplifier during high-temperature operation can be inhibited in this way.

A parasitic resistor of a narrow thin film metal wiring line or a contact resistor etc. may be used as the resistor element 14 or 15 in the seventh or eighth embodiment to obtain a resistance value lower than that of ordinary resistor elements. A power amplifier improved in stability while limiting the reduction in power-added efficiency can thus be obtained.

The capacitive components of the harmonic circuits 7a and 7b as seen from the gate electrode 2 of the transistor 1 can be adjusted by changing the thickness of the entire substrate or by making a portion of the substrate concave or convex. The capacitive components of the harmonic circuits 7a and 7b can be increased by reducing the thickness of the substrate to enable the circuit to be reduced in size. On the other hand, the capacitive components of the harmonic circuits 7a and 7b can be reduced by increasing the thickness of the substrate, thus enabling circuit constants to be finely adjusted, and facilitating the design of the harmonic circuits 7a and 7b.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-055194, filed on Mar. 18, 2016 including specification, claims, drawings and summary, on which the Convention priority of the present application is based, is incorporated herein by reference in its entirety.

The invention claimed is:

1. A power amplifier comprising:
a transistor having a gate electrode, a source electrode and a drain electrode;
a passive component part connected to the gate electrode through a gate wiring; and
a harmonic circuit connected between the source electrode and the gate wiring and disposed in a region between the gate electrode and the passive component part and between the source electrode and the gate wiring, wherein the harmonic circuit causes an impedance for a harmonic as seen from the gate electrode is set to a value for a short.

2. The power amplifier according to claim 1, wherein the source electrode includes first and second source electrodes respectively disposed on opposite sides of the gate wiring, and
the harmonic circuit includes a first harmonic circuit connected and disposed between the first source electrode and the gate wiring and a second harmonic circuit connected and disposed between the second source electrode and the gate wiring.

3. The power amplifier according to claim 2, wherein the first and second harmonic circuits are bilaterally symmetrically disposed, with the gate wiring interposed therebetween.

4. The power amplifier according to claim 1, further comprising a wiring element connected to the source electrode or the gate wiring and having the same potential,
wherein the harmonic circuit is disposed on the wiring element, and the wiring element is larger in width than the harmonic circuit.

5. The power amplifier according to claim 1, wherein the harmonic circuit has a plurality of harmonic circuits differing in size, and the harmonic circuit smaller in size is disposed closer to the gate electrode of the transistor than the harmonic circuit larger in size.

6. The power amplifier according to claim 1, wherein the harmonic circuit has a wiring element.

7. The power amplifier according to claim 1, wherein the harmonic circuit has a resistor element.

8. The power amplifier according to claim 1, wherein other power amplifiers are respectively connected in parallel with first and second sides of the passive component part opposite from each other, and
a resistor element is inserted in the passive component part between the first and second sides.

9. The power amplifier according to claim 1, wherein other power amplifier is connected in parallel with the passive component part, and a resistor element is connected between the passive component part and the other power amplifier.

10. The power amplifier according to claim 8, wherein the resistor element has a resistance value increasing with increase in temperature.

11. The power amplifier according to claim 8, wherein the resistor element is a parasitic resistor of a thin film metal wiring line or a contact resistor.

* * * * *